(12) United States Patent
Uchiyama et al.

(10) Patent No.: US 10,736,238 B2
(45) Date of Patent: Aug. 4, 2020

(54) SEMICONDUCTOR DEVICE

(71) Applicant: TOYOTA JIDOSHA KABUSHIKI KAISHA, Toyota-shi, Aichi-ken (JP)

(72) Inventors: Kazunori Uchiyama, Okazaki (JP); Naoki Hakamada, Anjo (JP); Tomo Sasaki, Toyota (JP); Masataka Deguchi, Nagoya (JP); Koji Hotta, Miyoshi (JP); Tadafumi Yoshida, Kasugai (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/263,580

(22) Filed: Jan. 31, 2019

(65) Prior Publication Data

US 2019/0246517 A1     Aug. 8, 2019

(30) Foreign Application Priority Data

Feb. 7, 2018   (JP) .................................. 2018-020291

(51) Int. Cl.
| | |
|---|---|
| *H01L 23/34* | (2006.01) |
| *H05K 7/20* | (2006.01) |
| *H01L 23/473* | (2006.01) |
| *H01L 23/367* | (2006.01) |
| *H01L 23/40* | (2006.01) |
| *H01L 23/373* | (2006.01) |

(52) U.S. Cl.
CPC ......... *H05K 7/2049* (2013.01); *H01L 23/367* (2013.01); *H01L 23/40* (2013.01); *H01L 23/4012* (2013.01); *H01L 23/473* (2013.01); *H05K 7/20927* (2013.01); *H01L 23/3735* (2013.01)

(58) Field of Classification Search
CPC .............. H05K 7/2049; H05K 7/20927; H01L 23/4012; H01L 23/40; H01L 23/367; H01L 23/473; H01L 23/3735
USPC ......................................................... 257/719
See application file for complete search history.

(56) References Cited

U.S. PATENT DOCUMENTS

| | | | |
|---|---|---|---|
| 6,320,268 B1* | 11/2001 | Lang ....................... | H01L 24/72 257/177 |
| 2015/0123261 A1* | 5/2015 | Hironaka ............... | H02M 7/003 257/719 |
| 2016/0286687 A1 | 9/2016 | Tajima et al. | |
| 2017/0196121 A1* | 7/2017 | Trygubova ........... | H05K 1/0201 |

FOREIGN PATENT DOCUMENTS

| | | |
|---|---|---|
| JP | 2015-104163 A | 6/2015 |
| WO | 2015/064572 A1 | 5/2015 |

* cited by examiner

*Primary Examiner* — Vu A Vu
(74) *Attorney, Agent, or Firm* — Oliff PLC

(57) ABSTRACT

A semiconductor device may include a stack in which a cooler and a semiconductor module are stacked, the semiconductor module housing a semiconductor element; a contact plate contacting the stack in a stacking direction of the semiconductor module and the cooler; and a spring contacting the contact plate and pressurizing the stack via the contact plate in the stacking direction, wherein the spring may contact a center portion of the contact plate in a direction perpendicular to the stacking direction, and a recess or a cavity may be provided at the center portion of the contact plate, the recess facing the stack.

4 Claims, 10 Drawing Sheets

SEMICONDUCTOR DEVICE

CROSS-REFERENCE TO RELATED APPLICATION

This application claims priority to Japanese Patent Application No. 2018-020291 filed on Feb. 7, 2018, the contents of which are hereby incorporated by reference into the present application.

TECHNICAL FIELD

The teaching disclosed herein relates to a semiconductor device in which a stack of a semiconductor module and a cooler is pressurized in a stacking direction by a spring. The semiconductor module houses a semiconductor element.

BACKGROUND

Japanese Patent Application Publication No. 2015-104163 (Patent Literature 1) and International Publication No. WO 2015/064572 (Patent Literature 2) each describe a semiconductor device in which a stack of a cooler and a semiconductor module is pressurized in a stacking direction thereof by a spring. The semiconductor device of Patent Literature 1 employs a plate spring curved in an arc shape. The plate spring is interposed between a pair of support posts provided in a casing and the stack. Both ends of the plate spring respectively contact the pair of support posts, and a center of the plate spring contacts an end surface of the stack in the stacking direction. The plate spring thereby applies pressure to a center of the end surface of the stack, and thus the pressure distributes unevenly on the end surface.

The semiconductor device of Patent Literature 2 employs two types of plate springs to pressurize the stack. Each of the plate springs is curved in an arc shape, and is interposed between an end surface of the stack and an inner wall of a casing. A first plate spring has its center in a longitudinal direction contact the stack, and has its both ends contact the inner wall of the casing. A second plate spring has its center in the londigudinal direction contact the inner wall of the casing, and has its both ends contact the stack. The first plate spring applies pressure to a center of the end face of the stack, and the second plate spring applies pressure to both ends of the end surface of the stack. A mere use of the first plate spring would make the pressure high at the center of the end surface and low at the both ends. By adding the second plate spring, pressure concentration at the center of the end surface of the stack can be reduced.

SUMMARY

The semiconductor device of Patent Literature 2 mitigates unevenness of the pressure on the end surface of the stack by using the two types of plate springs. The desclosure herein provides a technique which mitigates unevenness of pressure on an end surface of a stack by using a single spring.

A semiconductor device disclosed herein may comprise a stack, a contact plate, and a spring. The stack is a unit in which a semiconductor module and a cooler are stacked. The semiconductor module may house a semiconductor element. The contact plate may contact the stack in a stacking direction of the semiconductor module and the cooler. The spring may contact the contact plate and pressurize the stack in the stacking direction via the contact plate. The spring may be a type which pressurizes the stack by being inserted between the stack and a support portion of a casing housing the stack, or may be a type which pressurizes the stack by holding the stack from both sides thereof, similarly to a clip. The spring may contact a center portion of the contact plate in a direction perpendicular to the stacking direction. A recess may be provided at the center portion of the contact plate, and the recess may face the stack. In this semiconductor device, the center portion of the contact plate does not contact the stack, and portions located on both sides of the center portion pressurize the stack. By pressurizing the stack with the portions located on the both sides of the center portion, unevenness of pressure on an end surface of the stack can be reduced.

The contact plate may comprise a cavity at the center portion instead of the recess. In a range of the cavity as seen in the staking direction, a pressure which the spring applies to the stack is weakened. As a result, the unevenness of pressure on the end surface of the stack can be reduced.

Details and further improvements of the teaching disclosed herein will be described in the detailed description below.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

Figure 1:
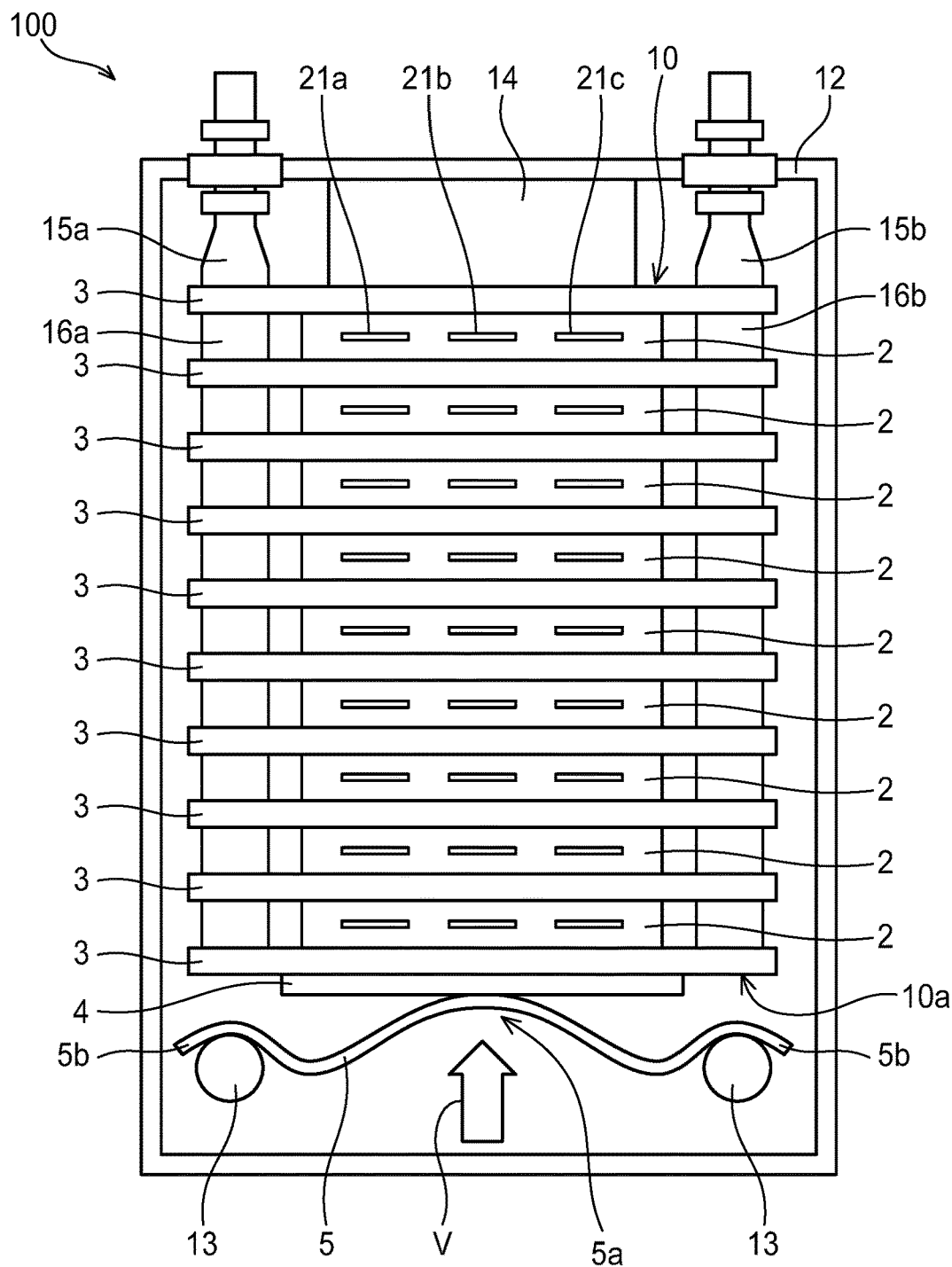
FIG. 1 is a plan view of a semiconductor device of a first embodiment.

A semiconductor device 100 according to a first embodiment will be described with reference to FIGS. 1 to 6. FIG. 1 shows a plan view of the semiconductor device 100. FIG. 1 is the plan view in a state where an upper cover of a casing 12 of the semiconductor device 100 is detached. The semiconductor device 100 houses a stack 10 of a plurality of semiconductor modules 2 and a plurality of coolers 3 inside the casing 12. The casing 12 further houses other components aside from the stack 10, however, depiction thereof will be omitted.

All of the semiconductor modules 2 and the coolers 3 have a flat shape, and are stacked such that their widest surfaces face each other. The plurality of semiconductor modules 2 and the plurality of coolers 3 are stacked alternately one by one. Grease and an insulation plate are interposed between each semiconductor module 2 and its corresponding cooler 3 adjacent to each other, however, depiction thereof is omitted in FIG. 1. Further, an X direction in a coordinate system in the drawing corresponds to a stacking direction of the coolers 3 and the semiconductor modules 2. In the other drawings as well, the X direction corresponds to the stacking direction.

Semiconductor elements are housed inside each of the semiconductor modules 2. Each of the semiconductor modules 2 contacts its corresponding coolers 3 to cool the semiconductor elements therein. An internal structure of the semiconductor modules 2 will be described later. In the stack 10, each semiconductor module 2 is interposed between a pair of the coolers 3, and thus each semiconductor module 2 is cooled from its both sides. One of the coolers 3 located at one end of the stack 10 is connected to a coolant supply pipe 15a and a coolant discharge pipe 15b. The coolant supply pipe 15a and the coolant discharge pipe 15b extend to outside of the casing 12. The coolant supply pipe 15a and the coolant discharge pipe 15b are connected with a coolant circulation device, which is not shown, outside of the casing 12. A coolant is supplied to the plurality of coolers 3 from the coolant circulation device through the coolant supply pipe 15a, and the coolant is returned to the coolant circulation device from the coolers 3 through the coolant discharge pipe 15b. The coolant may typically be water or an anti-freeze solution.

The adjacent coolers 3 are connected to each other by two connection pipes 16a, 16b. In FIG. 1, reference signs 16a, 16b are given to some of the connection pipes and the reference signs are omitted for the rest of the connection pipes. The coolers 3 each have a coolant flow passage therein. The flow passages of the adjacent coolers 3 are communicated by the connection pipes 16a, 16b. The connection pipes 16a are arranged to overlap with the coolant supply pipe 15a as seen along the stacking direction of the stack 10 (the X direction), and the connection pipes 16b are arranged to overlap with the coolant discharge pipe 15b as seen along the stacking direction. The coolant supplied through the coolant supply pipe 15a is distributed to all of the coolers 3 through the connection pipes 16a. While flowing through the coolers 3, the coolant absorbs heat from the semiconductor modules 2 adjacent to the coolers 3. The coolant that had absorbed heat is discharged from the stack 10 through the connection pipes 16b and the coolant discharge pipe 15b.

Figure 2:
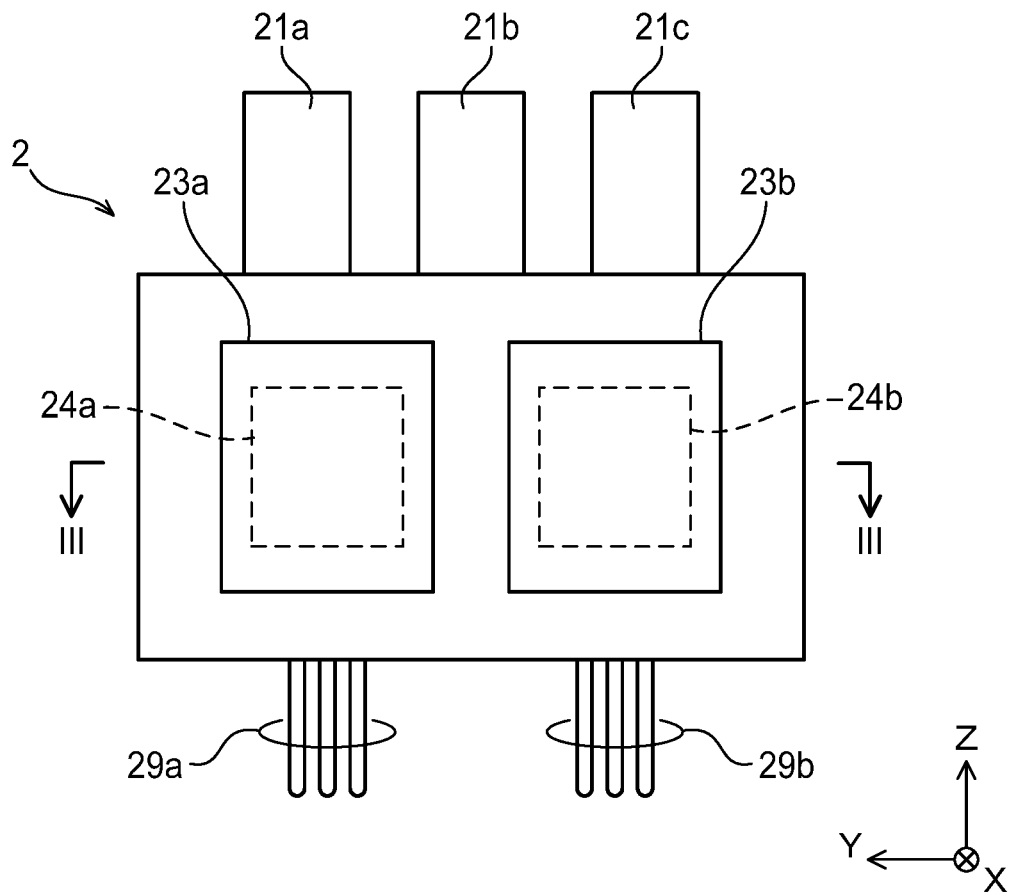
FIG. 2 is a front view of a semiconductor module.
Figure 3:
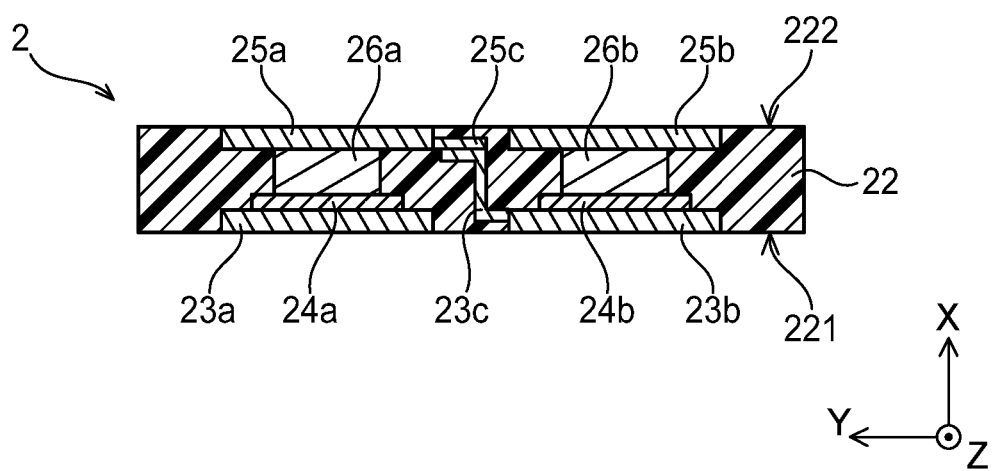
FIG. 3 is a cross-sectional view of the semiconductor module along a line III-III in FIG. 2.

Next, the internal structure of the semiconductor modules 2 will be described with reference to FIGS. 2 and 3. FIG. 2 is a plan view of one of the semiconductor modules 2, and FIG. 3 is a cross-sectional view thereof along a line III-III of FIG. 2. The semiconductor module 2 is a device that houses two semiconductor elements 24a, 24b in a resin package 22. The package 22 is formed by injection molding. That is, the two semiconductor elements 24a, 24b are embedded inside the package 22.

The semiconductor elements 24a, 24b are flat plate type chips, each are provided with a collector electrode on one of widest surfaces of the flat plate and with an emitter electrode and control electrodes, such as a gate electrode, on the other of the widest surfaces thereof. The collector electrode of the semiconductor element 24a is bonded to a heat radiation plate 23a, and the emitter electrode thereof is bonded to a spacer 26a. A heat radiation plate 25a is bonded to the spacer 26a on an opposite side from the emitter electrode. Terminals 29a are bonded to the control electrodes of the semiconductor element 24a.

The collector electrode of the semiconductor element 24b is bonded to a heat radiation plate 23b, and the emitter electrode thereof is bonded to a spacer 26b. A heat radiation plate 25b is bonded to the spacer 26 on an opposite side from the emitter electrode. Terminals 29b are connected to the control electrodes of the semiconductor element 24b.

The semiconductor element 24a is interposed between the pair of heat radiation plates 23a, 25a, and the semiconductor element 24b is interposed between the pair of heat radiation plates 23b, 25b. The heat radiation plates 23a, 23b, 25a, 25b and the spacers 26a, 26b are constituted of electrically conductive metal. The heat radiation plates 23a, 23b are exposed at one widest surface 221 of the package 22 and the heat radiation plates 25a, 25b are exposed at another widest surface 222 thereof. A joint 25c extends from an edge of the heat radiation plate 25a and a joint 23c extends from an edge of the heat radiation plate 23b. The joint 25c and the joint 23c are connected inside the package 22. Although not shown in the drawings, the heat radiation plate 23a is connected with a positive terminal 21a extending to outside of the package 22, the heat radiation plate 25a is connected with an intermediate terminal 21b, and the heat radiation plate 25b is connected with a negative terminal 21c.

The heat radiation plates 23a, 23b, 25a, 25b have a function to dissipate heat from the semiconductor elements 24a, 24b and a function to electrically conduct the electrodes of the semiconductor elements 24a, 24b with the positive terminal 21a, the intermediate terminal 21b, and the negative terminal 21c extending to outside of the package 22. As shown in FIG. 2, when seen along a normal direction of the widest surfaces (the X direction in the drawing), the heat radiation plate 23a and the semiconductor element 24a overlap with each other, and the heat radiation plate 23b and the semiconductor element 24b overlap with each other. As aforementioned, the X direction corresponds to the stacking direction of the semiconductor modules 2 and the coolers 3. The widest surfaces 221, 222 where the heat radiation plates 23a, 23b, 25a, 25b are exposed face the coolers 3. As shown in FIG. 2, when seen along the normal direction of the widest surfaces (the stacking direction), the semiconductor element 24a (24b) is located inside an outline (a profile) of the heat radiation plate 23a (23b). With this arrangement, heat of the semiconductor element 24a (24b) is efficiently transmitted to entire surfaces of the heat radiation plates 23a (23b) and 25a (25b).

Figure 4:
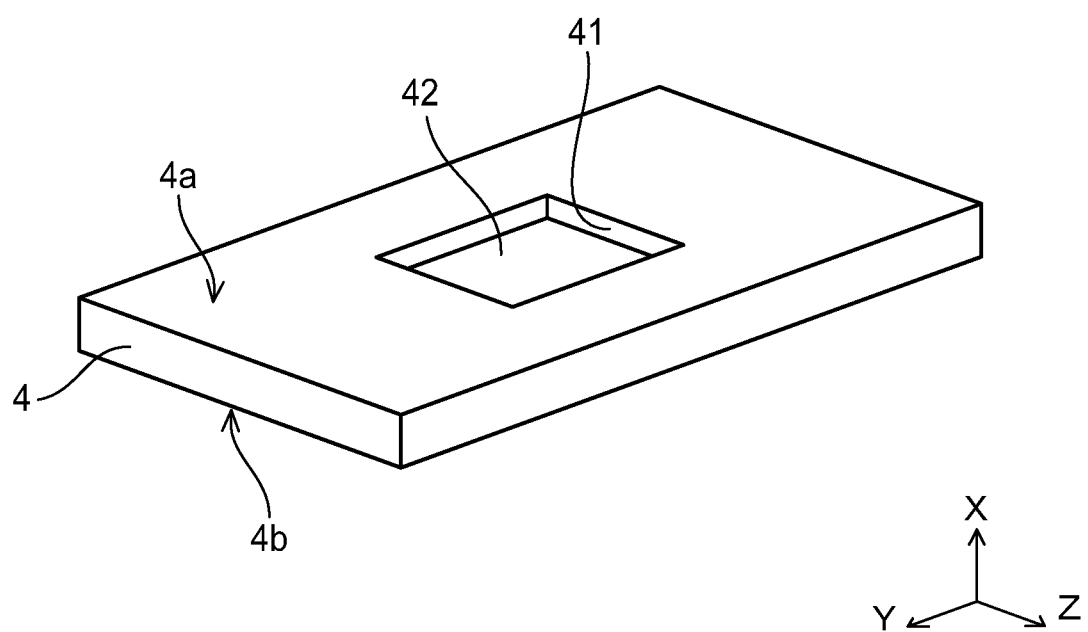
FIG. 4 is a perspective view of a contact plate.

Returning to FIG. 1, the description on the semiconductor device 100 will be continued. In FIG. 1, the reference signs 21a, 21b, 21c indicating the terminals are given to only one of the semiconductor modules 2, and the reference signs for the terminals are omitted for the remaining semiconductor modules 2. The stack 10 of the semiconductor modules 2 and the coolers 3 is interposed between a wall 14 of the casing 12 and support posts 13. A spring 5 and a contact plate 4 are interposed between an end surface 10a of the stack 10 in the stacking direction and the support posts 13. The spring 5 pressurizes the stack 10 in the stacking direction via the contact plate 4. A degree of adhesion between the semiconductor modules 2 and the coolers 3 is increased by the pressurization, by which heat is transferred efficiently from the semiconductor modules 2 to the coolers 3. The spring 5 is a plate spring curved in an arc shape. The spring 5 has its both ends 5b respectively contact the support posts 13, and has its center portion 5a contact a center of the contact plate 4. The contact plate 4 distributes concentrated load generated by the spring 5 over the end surface 10a of the stack 10. However, the contact plate 4 slightly bends by receiving the concentrated load from the spring 5. When the contact plate 4 bends, pressure concentrates to a center portion of the end surface 10a of the stack 10. Thus, a recess is provided in a surface of the contact plate 4 facing the stack 10. FIG. 4 shows a perspective view of the contact plate 4. In FIG. 4, an upper surface of the contact plate 4 corresponds to a contact surface 4a facing the stack 10. In FIG. 4, a lower surface of the contact plate 4 corresponds to a pressurized surface 4b contacting the spring 5. A recess 41 is provided at a center of the contact surface 4a of the contact plate 4. A portion of the contact plate 4 corresponding to a bottom of the recess 41 will be termed a center portion 42.

Figure 5:
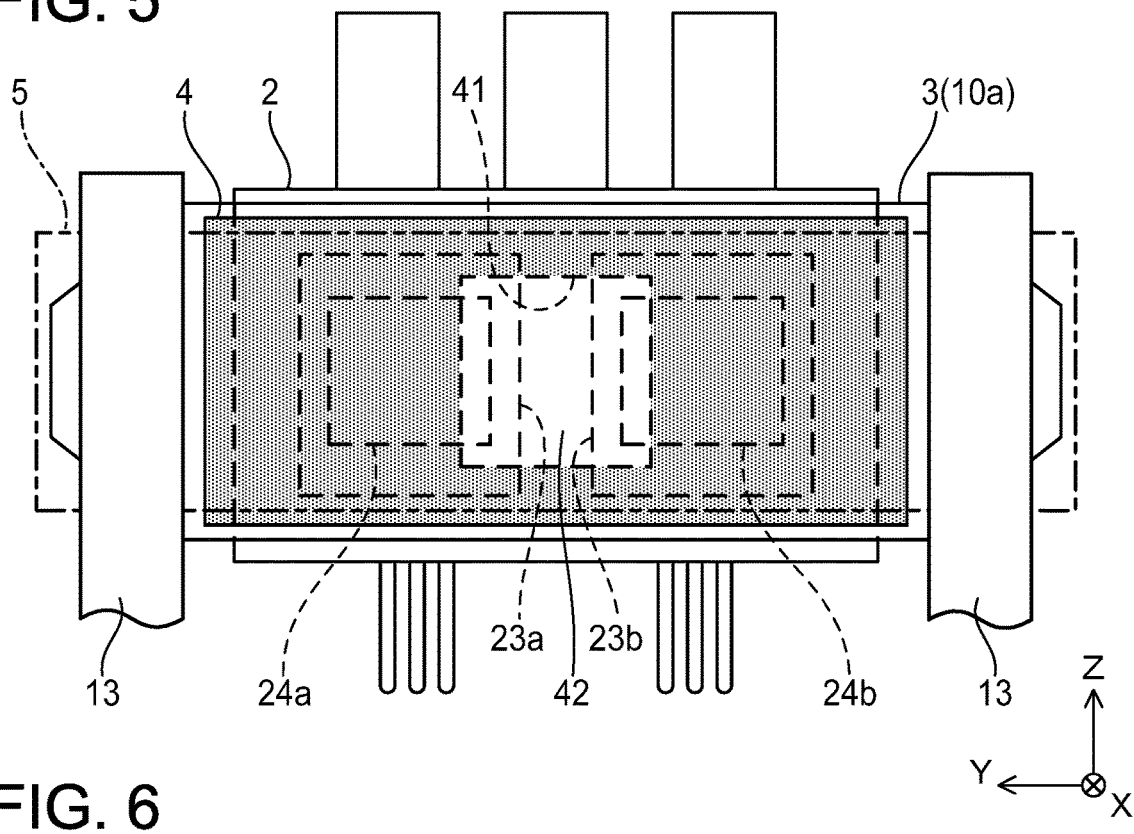
FIG. 5 is a front view of the semiconductor device seen along a direction of an arrow V in FIG. 1.
Figure 6:
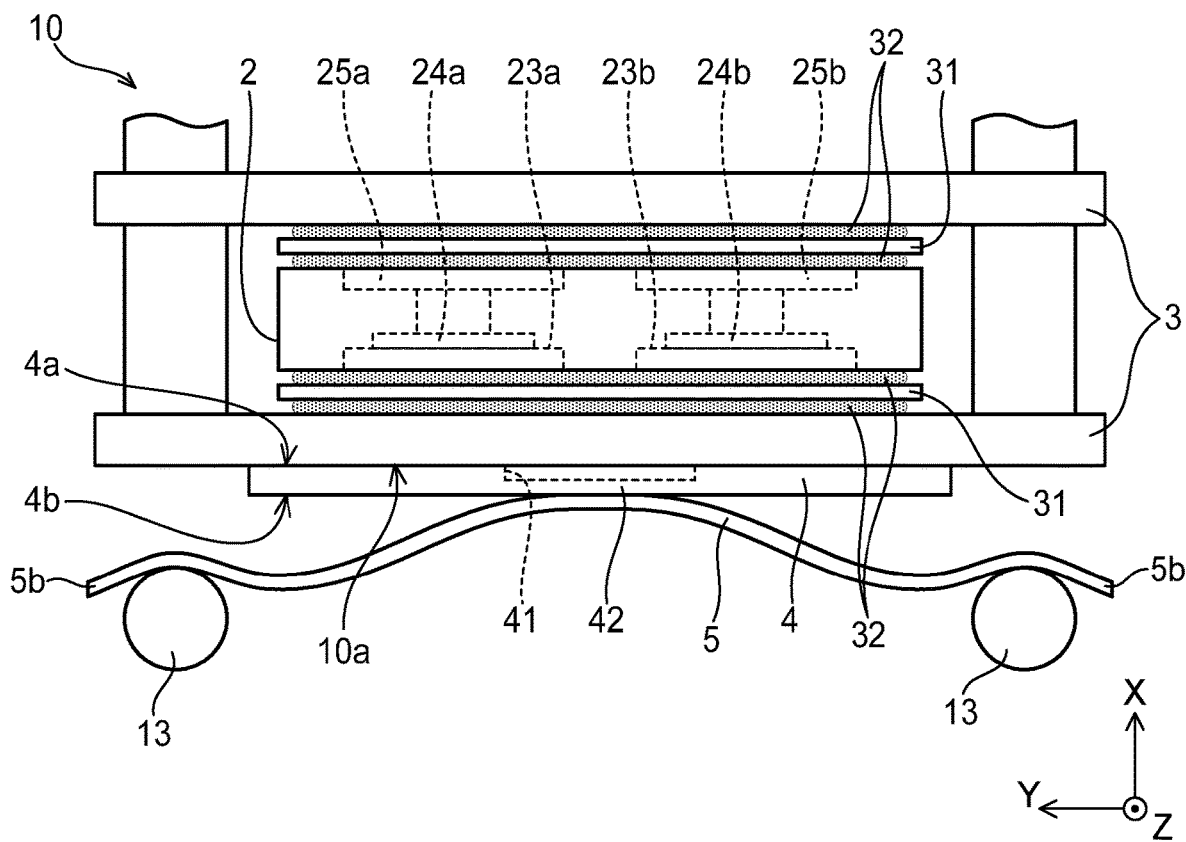
FIG. 6 is an enlarged plan view around the contact plate.

FIG. 5 shows a front view of the semiconductor device 100 as seen along an arrow V of FIG. 1 (a front view of the stack 10), and FIG. 6 shows an enlarged plan view around the contact plate 4. FIG. 5 is the front view of the semiconductor device 100 with the casing 12 being omitted. In FIG. 5, a range where the contact plate 4 contacts one cooler 3 (the cooler 3 corresponding to the end surface 10a of the stack 10) is depicted in gray. A white portion surrounded by the gray range corresponds to the recess 41 and the center portion 42. Further, in FIG. 5, the spring 5 is shown by a one-dot chain line.

As clearly shown in FIGS. 5 and 6, the spring 5 contacts the center portion 42 of the contact plate 4. The contact plate 4 contacts the end surface 10a of the stack 10 (the cooler 3 at the end of the stack 10) around the recess 41 to surround it. The spring 5 pressurizes the center portion 42 of the contact plate 4. However, the contact plate 4 is provided with the recess 41 such that the center portion 42 does not contact the end surface 10a of the stack 10. Even when the contact plate 4 bends by the load from the spring 5, the center portion 42 of the contact plate 4 does not contact the stack 10 because of the recess 41. The contact plate 4 contacts the end surface 10a around the recess 41 to surround it (the gray range in FIG. 5). According to this configuration, unevenness of pressure on the end surface 10a of the stack 10 is reduced.

As shown in FIG. 6, insulation plates 31 are interposed between each semiconductor module 2 and its corresponding coolers 3. Further, grease 32 is applied between the semiconductor module 2 and the insulation plates 31 as well as between the coolers 3 and the insulation plates 31. In FIG. 6, the grease is depicted in gray. As aforementioned, the heat radiation plates 23a, 23b, 25a, 25b are electrically conductive with the electrodes of the semiconductor elements 24a, 24b. The coolers 3 are also constituted of electrically conductive metal (which is typically aluminum). Due to this, the insulation plates 31 are interposed to insulate the heat radiation plates 23a, 23b, 25a, 25b from the coolers 3. The grease 32 is applied to increase heat transfer efficiency between the solid insulation plates 31 and coolers 3 as well as between the insulation plates 31 and the semiconductor module 2.

Figure 7:
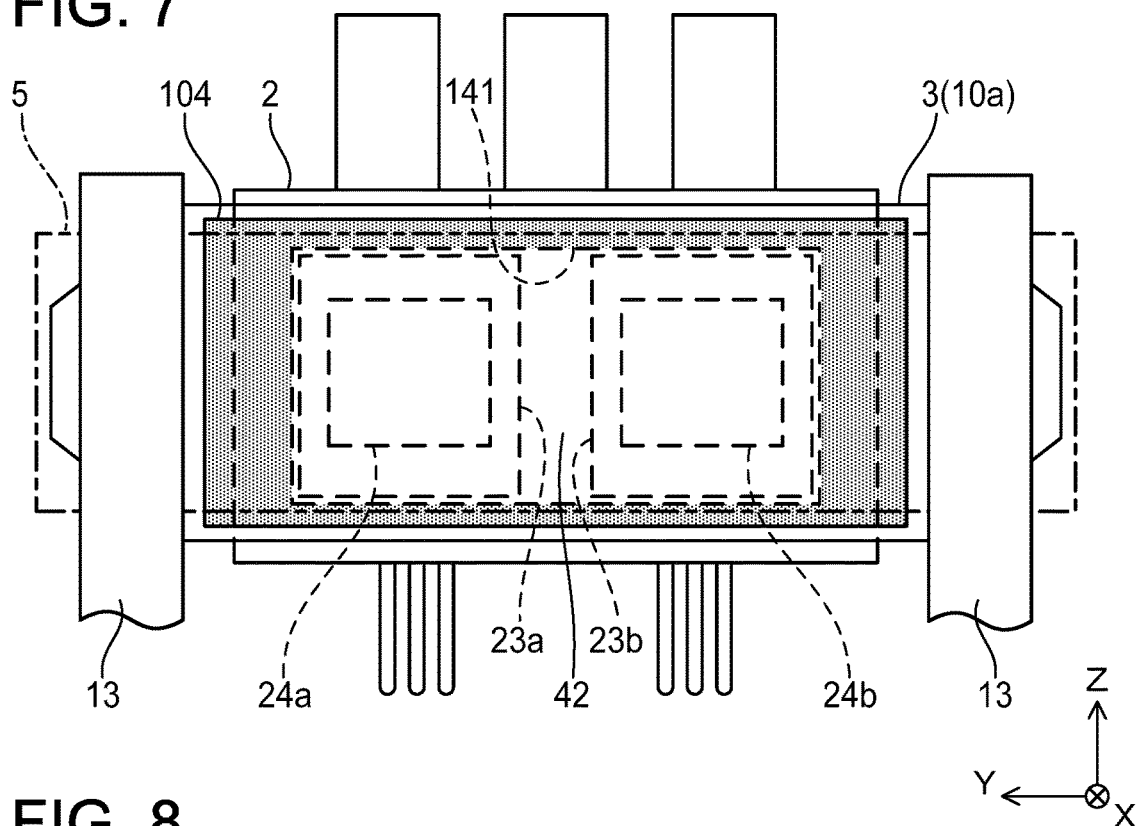
FIG. 7 is a front view showing a first variant of the contact plate.
Figure 8:
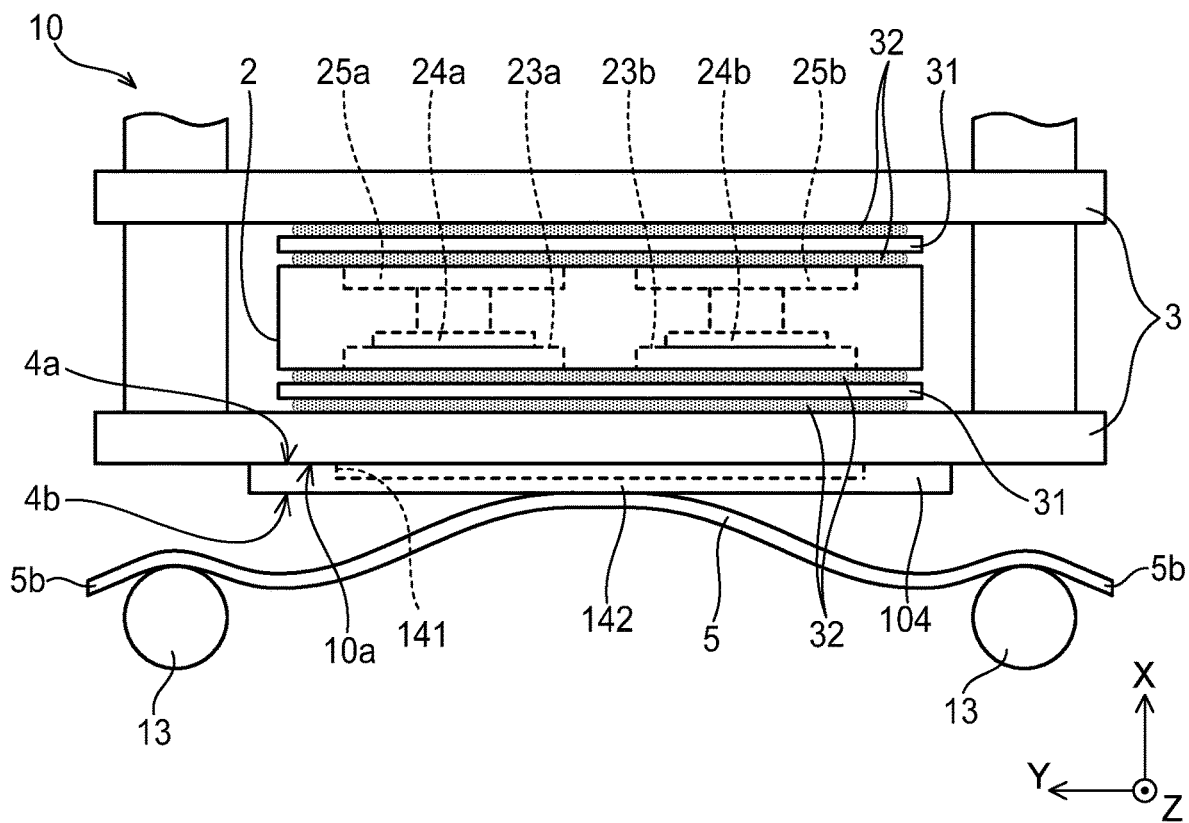
FIG. 8 is an enlarged plan view around the contact plate of the first variant.

(First Variant) A first variant of the contact plate will be described with reference to FIGS. 7 and 8. FIG. 7 is a drawing corresponding to FIG. 5. FIG. 7 is a front view showing a contact plate 104 of the first variant. FIG. 8 is a drawing corresponding to FIG. 6. FIG. 8 is an enlarged view around the contact plate 104 of the first variant. In FIGS. 7 and 8, components identical to the components of FIGS. 5 and 6 are given the same reference signs. A gray portion of FIG. 7 shows a range where the contact plate 104 contacts the end surface 10a of the stack 10. A range surrounded by the gray range corresponds to a recess 141. The range surrounded by the gray range also corresponds to a center portion 142 corresponding to a bottom of the recess 141. The spring 5 contacts the pressurized surface 4b of the contact plate 104 at the center portion 142. However, the recess 141 is provided at the center portion 142 on a stack 10 side (the contact surface 4a), thus the center portion 142 of the contact plate 104 does not directly apply pressure to the end surface 10a of the stack 10.

A size of the recess 141 of the contact plate 104 of the first variant is larger than a size of the recess 41 of the contact plate 4 of the first embodiment. As shown in FIGS. 7 and 8, when seen along the X direction in the coordinate system of the drawings (the stacking direction of the stack 10), the recess 141 is provided such that an outline (a profile) of the recess 141 entirely surrounds the heat radiation plates 23a, 23b exposed at the widest surface of the semiconductor module 2 on a contact plate 104 side.

The grease 32 is applied to the surface of the semiconductor module 2 where the heat radiation plates 23a, 23b are exposed. When temperature of the semiconductor elements 24a, 24b inside the semiconductor module 2 repeatedly rises and falls, the heat radiation plates 23a, 23b repeatedly undergo thermal deformation. The repetition of the thermal deformation of the heat radiation plates 23a, 23b might push the grease 32 out from a range of the heat radiation plates 23a, 23b. A phenomenon in which the grease 32 is pushed out from the range of the heat radiation plates 23a, 23b will hereinbelow be termed "grease flows out". When the grease 32 flows out, the cooling efficiency for the semiconductor module 2 may be decreased. When the recess 141 is provided in a range facing the heat radiation plates 23a, 23b, the pressure which the contact plate 104 applies to the range of the heat radiation plates 23a, 23b can be suppressed, by which the grease 32 less likely flows out. This effect can be achieved by the contact plate 4 of the first embodiment as well. However, the contact plate 104 including the recess 141 which entirely surrounds (covers) the heat radiation plates 23a, 23b has a higher effect, since the grease less likely flows out from the entire surfaces of the heat radiation plates 23a, 23b.

Figure 9:
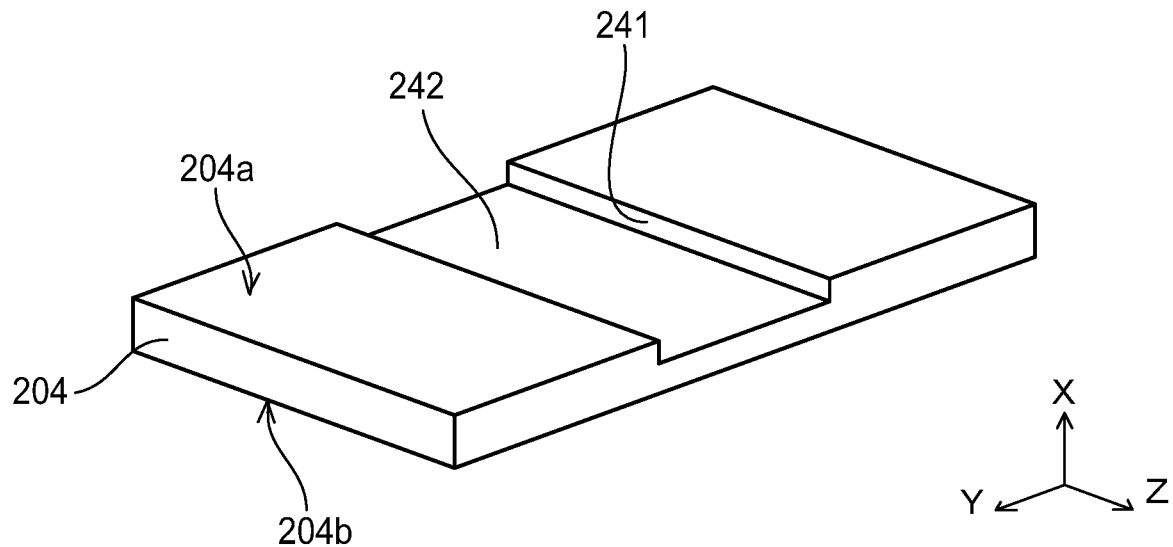
FIG. 9 is a perspective view showing a second variant of the contact plate.
Figure 10:
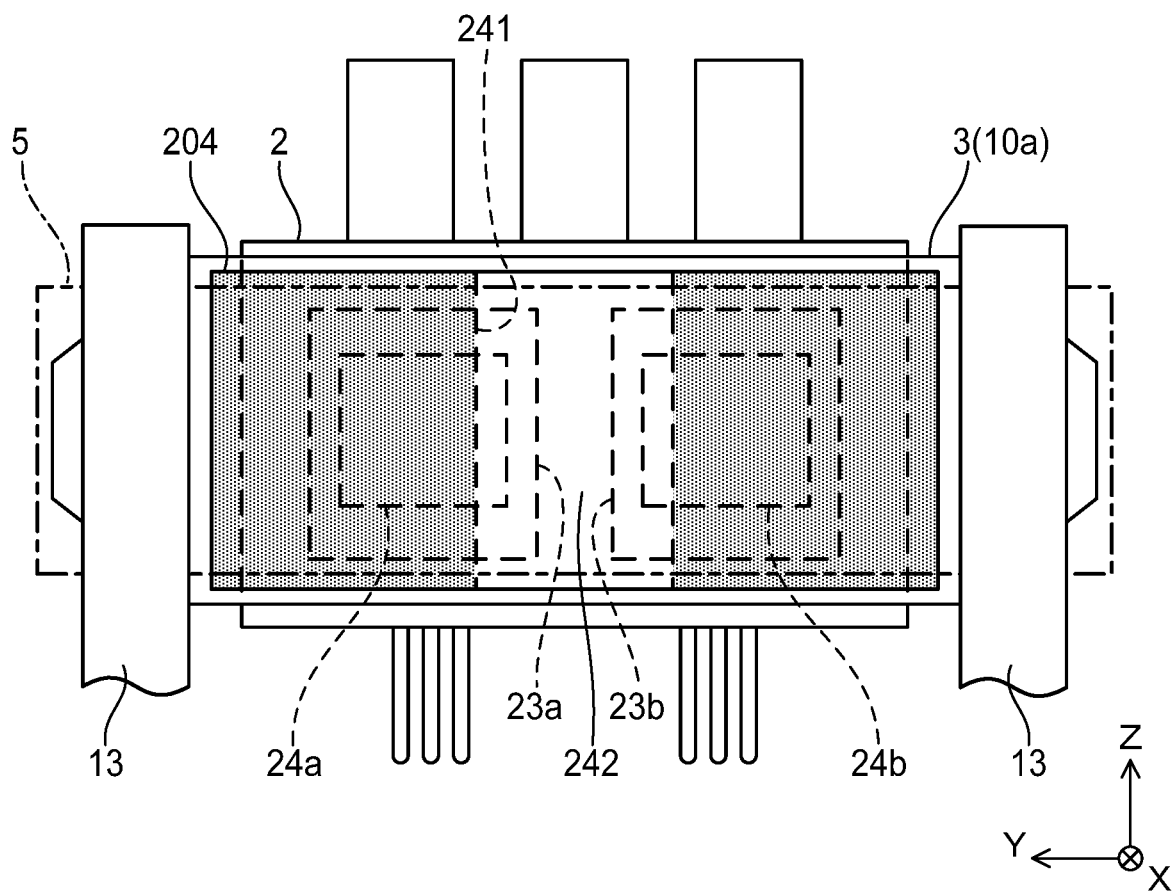
FIG. 10 is a front view showing the second variant of the contact plate.

(Second Variant) A second variant of the contact plate will be described with reference to FIGS. 9 and 10. FIG. 9 is a perspective view of a contact plate 204 of the second variant. FIG. 10 is a drawing corresponding to FIG. 5, and is a front view showing the contact plate 204 of the second variant. In FIG. 10, components identical to the components of FIG. 5 are given the same reference signs. Gray portions of FIG. 10 show ranges where the contact plate 204 contacts the end surface 10a of the stack 10.

The contact plate 204 includes a recess 241 in a contact surface 204a facing the stack 10. The recess 241 extends from one edge to the other edge of the contact plate 204 in a short direction of the contact plate 204 (a Z direction in the drawings). The recess 241 has a groove shape traversing the contact plate 204 in the short direction. A portion of the contact plate 204 corresponding to a bottom of the recess 241 is a center portion 242. The spring 5 contacts the center portion 242 of the contact plate 204 on a pressurized surface 204b on an opposite side from the contact surface 204a. In FIG. 10 a range interposed between the gray portions corresponds to the recess 241, and also corresponds to the center portion 242 corresponding to the bottom of the recess 241. As in the second variant, the recess 241 may be a groove extending from one end to the other end of the contact plate 204 in the short direction. The spring 5 contacts the center portion 242 of the contact plate 204, however, the center portion 242 of the contact plate 204 does not contact the end surface 10a of the stack 10. The contact plate 204 contacts the end surface 10a on both sides of the recess 241 in a longitudinal direction (a Y direction in the drawings). With the contact plate 204 of the second variant as well, the unevenness of pressure on the end surface 10a can be reduced.

Figure 11:
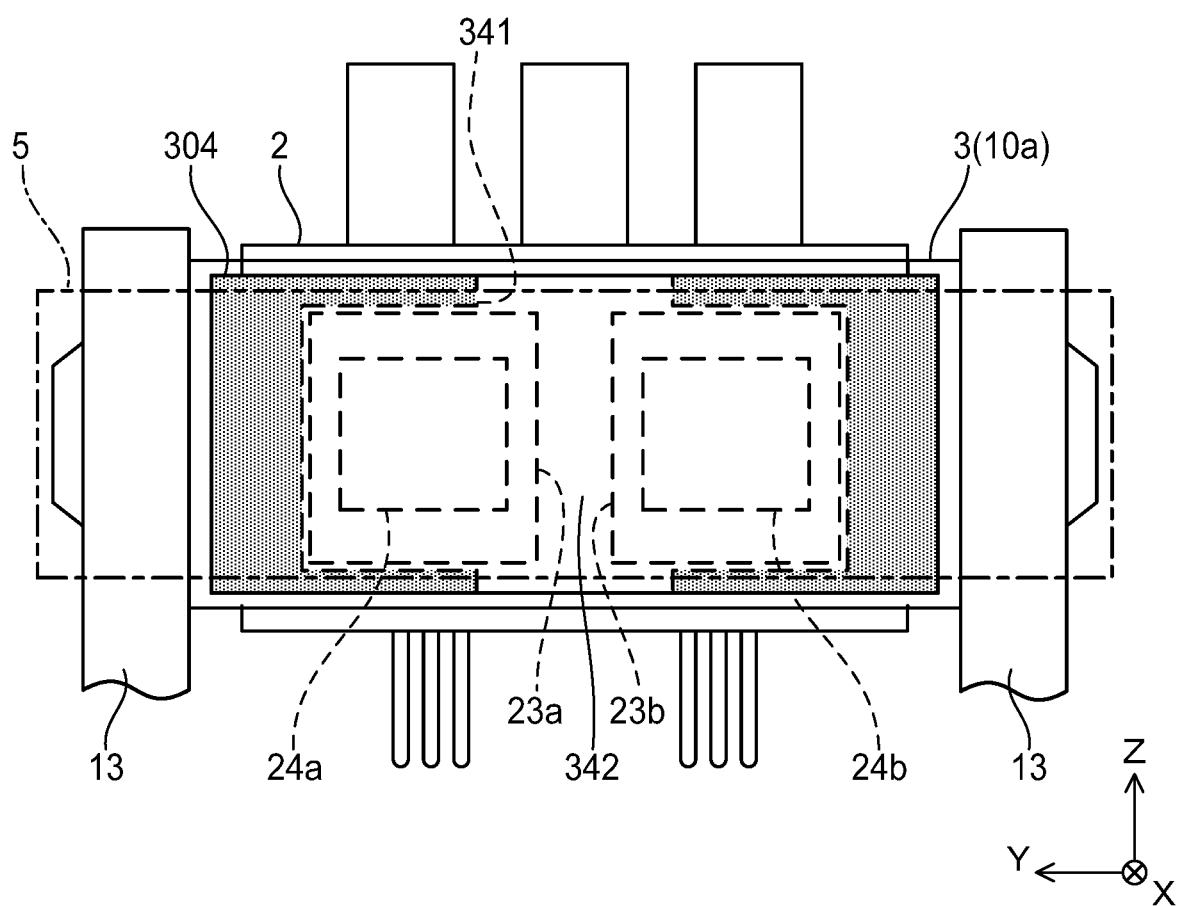
FIG. 11 is a front view showing a third variant of the contact plate.

(Third Variant) A contact plate 304 of a third variant will be described with reference to FIG. 11. FIG. 11 is a drawing corresponding to FIG. 10, and is a front view showing the contact plate 304 of the third variant. In FIG. 11 components identical to the components of FIG. 10 are given the same reference signs. Gray portions of FIG. 11 show ranges where the contact plate 304 contacts the end surface 10a of the stack 10. The contact plate 304 of the third variant also includes a recess 341 in its contact surface facing the end surface 10a of the stack 10. A portion corresponding to a bottom of the recess 341 is a center portion 342.

The recess 341 traverses the contact plate 304 along a short direction of the contact plate 304 (the Z direction in the drawing). Further, the recess 341 is along boundaries of the heat radiation plates 23a, 23b of the semiconductor module 2 when seen along the stacking direction (the X direction in the drawing).

The spring 5 contacts the center portion 342 of the contact plate 304, however, the center portion 342 of the contact plate 304 does not contact the end surface 10a of the stack 10. The contact plate 304 contacts the end surface 10a on both sides of the recess 341 in a longitudinal direction (the Y direction in the drawing). With the contact plate 304 of the third variant as well, the unevenness of pressure on the end surface 10a can be reduced. Further, as seen along the X direction (the stacking direction), an outline of the recess 341 surrounds parts of the heat radiation plates 23a, 23b in the Y direction (the longitudinal direction of the contact plate 304). With the recess 341 surrounding the heat radiation plates 23a, 23b as such the grease applied to the heat radiation plates 23a, 23b less likely flows out as aforementioned.

Second Embodiment

Figure 12:
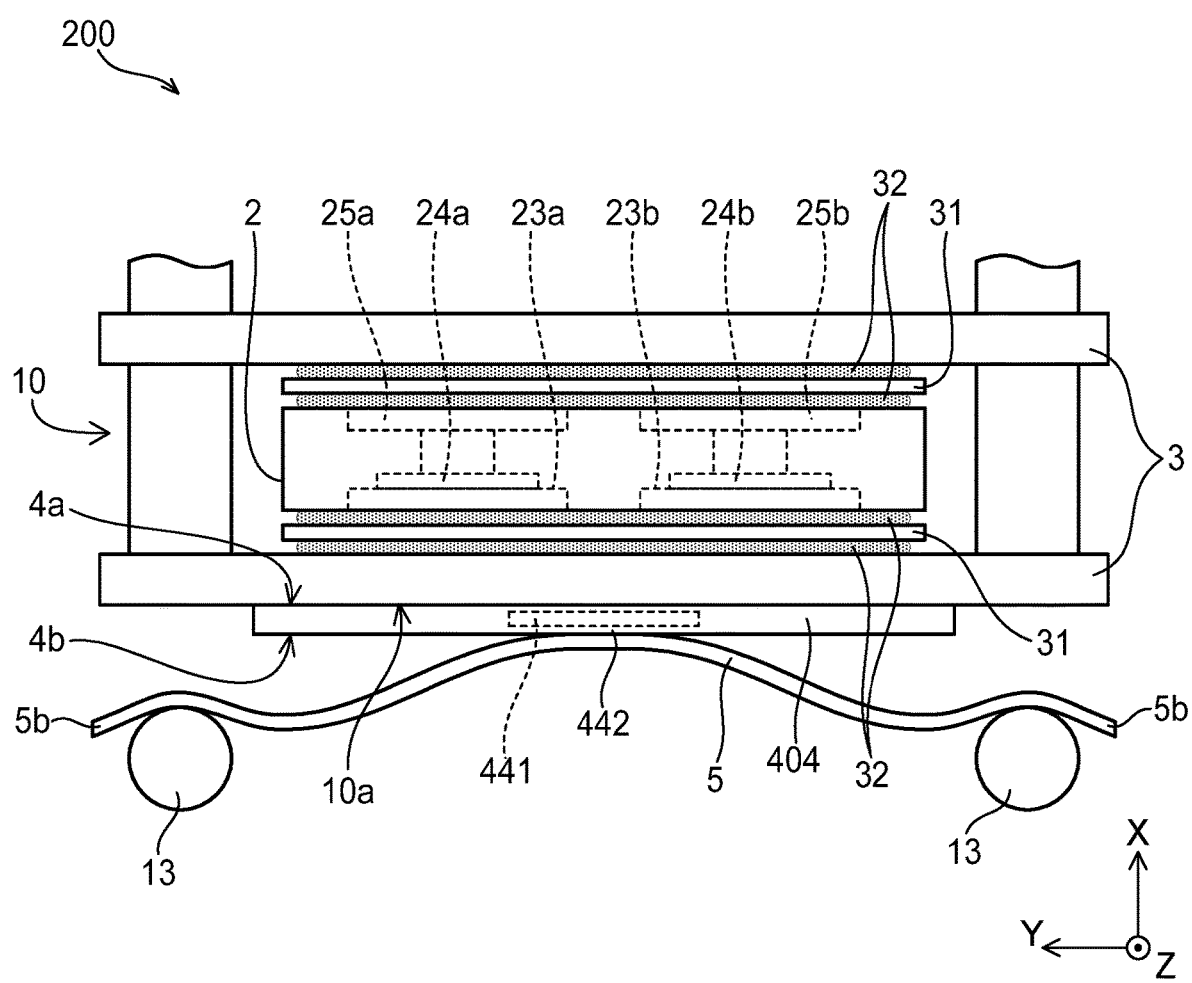
FIG. 12 is an enlarged plan view around a contact plate of a semiconductor device of a second embodiment.

A semiconductor device 200 according to a second embodiment will be described with reference to FIG. 12. FIG. 12 is a drawing corresponding to FIG. 6, and is a plan view around a contact plate 404. The semiconductor device 200 includes the same structure as that of the semiconductor device 100 of the first embodiment, except for the contact plate 404. The contact plate 404 is provided with a cavity 441 at its center portion 442. The spring 5 contacts the center portion 442 on a pressurized surface 4b side. Even when the center portion 442 of the contact plate 404 deforms by the load from the spring 5, the deformation of the center portion 442 becomes smaller on a contact surface 4a side than on the pressurized surface 4b side due to the cavity 441. As such, the pressure concentration to the center of the end surface 10a of the stack 10 can be alleviated.

Third Embodiment

Figure 13:
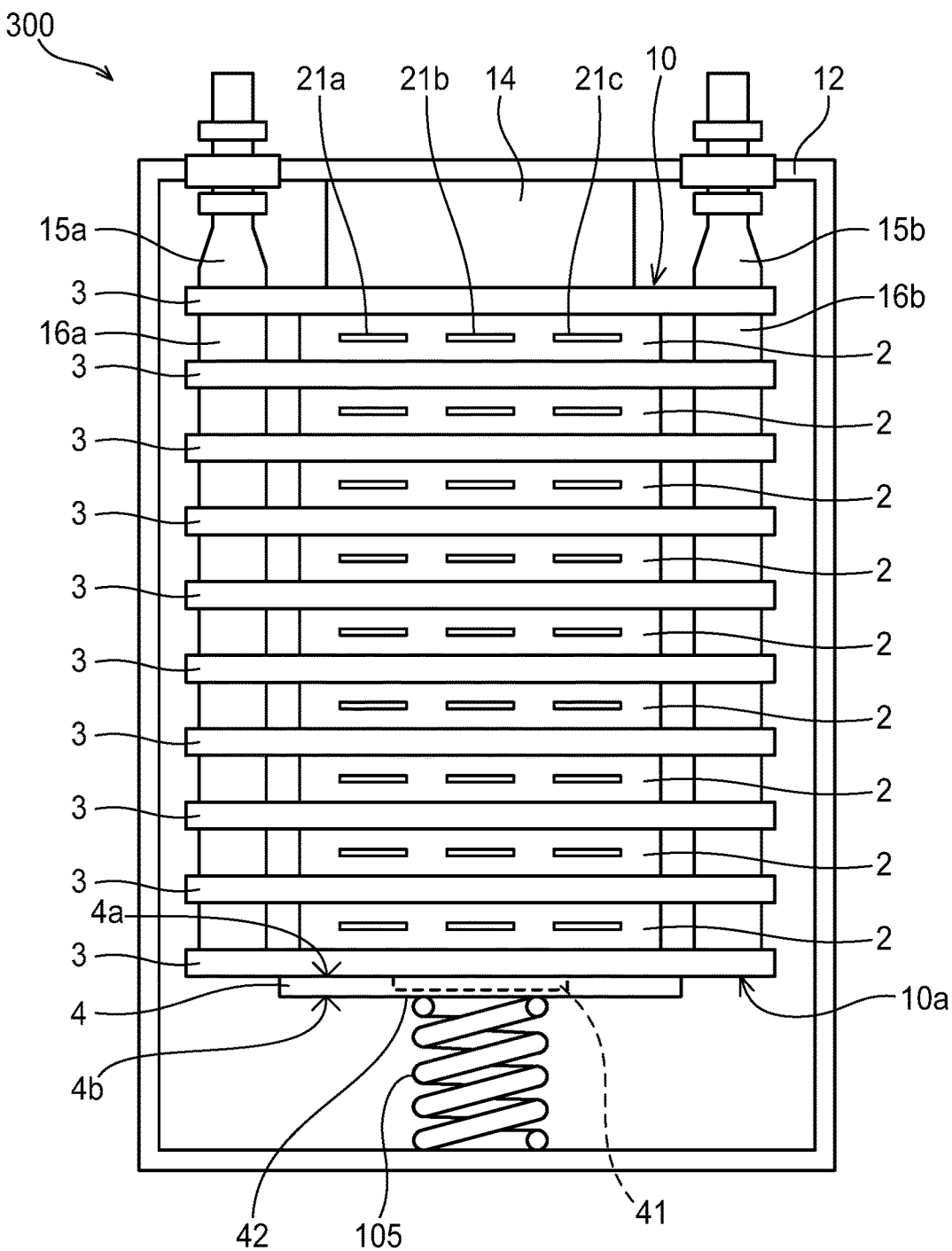
FIG. 13 is a plan view of a semiconductor device of a third embodiment.

A semiconductor device 300 according to a third embodiment will be described with reference to FIG. 13. FIG. 13 is a drawing corresponding to FIG. 1 and is a plan view of the semiconductor device 300. The semiconductor device 300 includes the same structure as that of the semiconductor device 100 of the first embodiment, except for a spring 105. That is as shown in FIG. 4, the contact plate 4 is provided with the recess 41 at the center of the contact surface 4a facing the stack 10.

The semiconductor device 300 according to the third embodiment includes a coil spring (spring 105) as a substitute to the plate spring. The spring 105 pressurizes the stack 10 via the contact plate 4. The spring 105 contacts the center portion 42 of the contact plate 4 on the pressurized surface 4b side to pressurize the contact plate 4. Since the recess 41 is provided at the center portion 42 of the contact plate 4 on the contact surface 4a side, the center portion 42 does not contact the end surface 10a, and thus the contact plate 4 contacts the end surface 10a of the stack 10 on both sides of the recess 41 in the Y direction. As such the unevenness of pressure to the center of the end surface 10a can be reduced.

Fourth Embodiment

Figure 14:
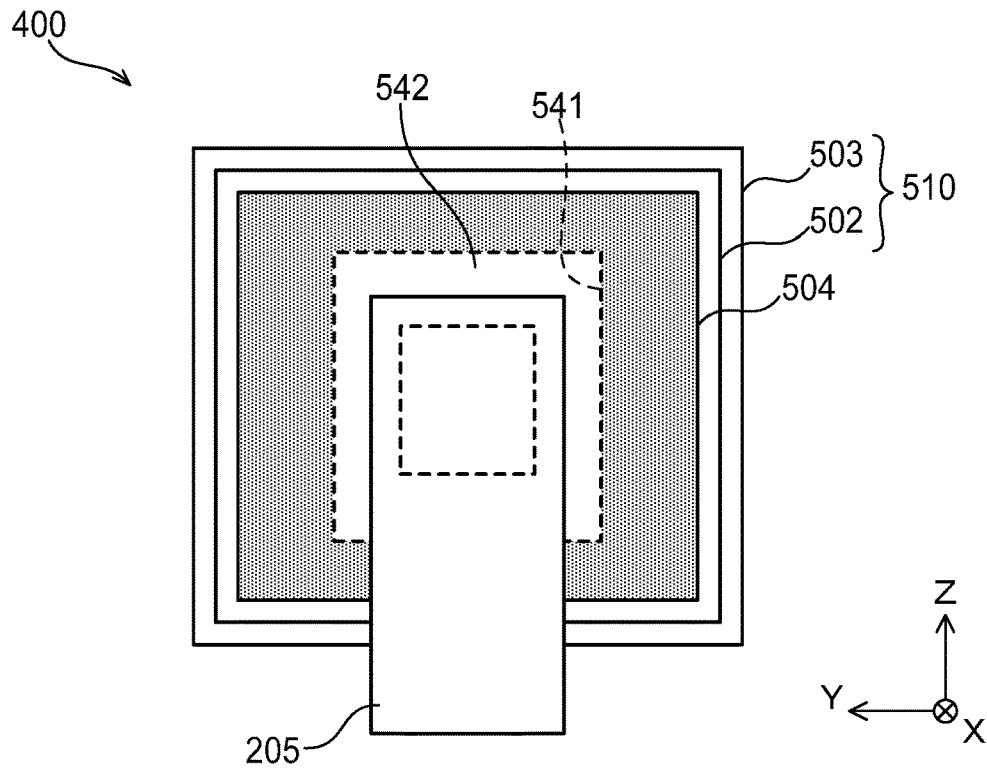
FIG. 14 is a plan view of a semiconductor device of a fourth embodiment.
Figure 15:
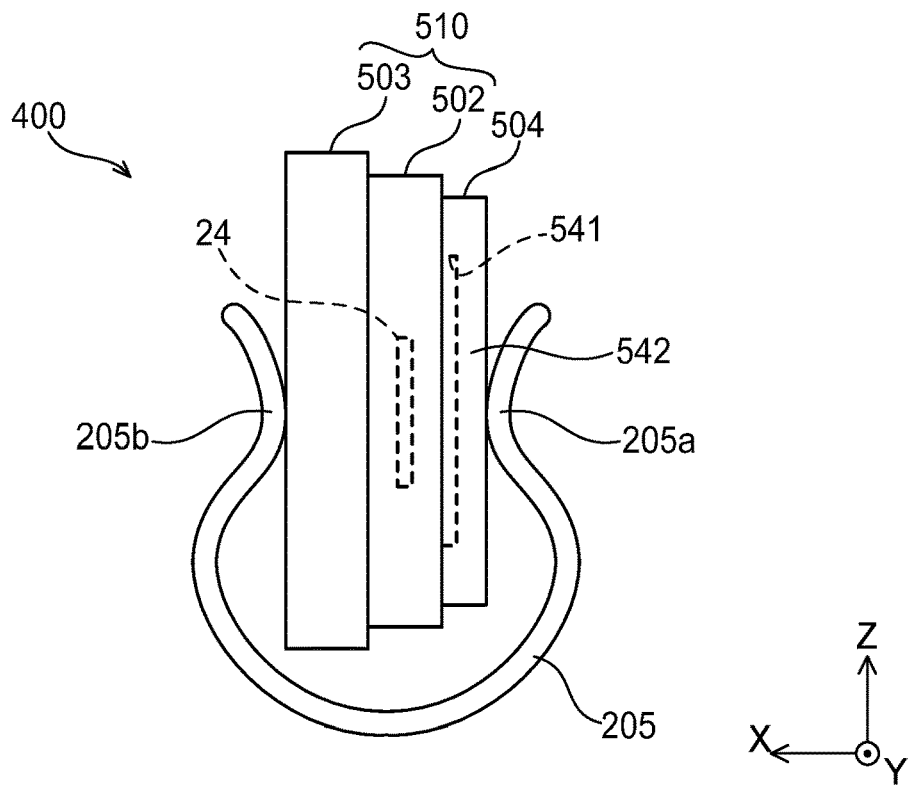
FIG. 15 is a side view of the semiconductor device of the fourth embodiment.

A semiconductor device 400 according to a fourth embodiment will be described with reference to FIGS. 14 and 15. The semiconductor device 400 according to the fourth embodiment includes a clip-shaped spring 205. The spring 205 is provided with a pair of holding portions 205a, 205b facing each other. A contact plate 504 and a stack 510 of a semiconductor module 502 housing a semiconductor element 24 and a cooler 503 are interposed between the holding portions 205a, 205b. The spring 205 pressurizes the stack 510 from both sides thereof in the stacking direction.

The contact plate 504 is provided with a recess 541 in a surface thereof facing the semiconductor module 502. The recess 541 has a profile that surrounds a range where the spring 205 pressurizes the contact plate 504. In FIG. 14, a gray range indicates a range where the contact plate 504 and the semiconductor module 502 contact each other. The spring 205 applies pressure intensively to a center portion 542 of the contact plate 504, however, the recess 541 is provided in the center portion 542 of the contact plate 504 on the side facing the semiconductor module 502. Due to this, the center portion 542 does not pressurize the semiconductor module 502. Instead, the contact plate 504 pressurizes the semiconductor module 502 around the center portion 542. Thus, the unevenness of pressure on an end surface of the stack 510 in the stacking direction is reduced.

Some of the features according to the teachings described in the embodiments will be listed below. The semiconductor device includes the stack 10 of the semiconductor modules 2 and the coolers 3 the contact plate 4, and the spring 5. The contact plate 4 contacts the end surface of the stack 10 in the stacking direction (the X direction). The spring 5 contacts the contact plate 4, and pressurizes the stack 10 in the stacking direction via the contact plate 4. The spring 5 contacts the center portion 42 of the contact plate 4 in the direction perpendicular to the stacking direction (the Y direction in the drawings). The recess 41 is provided at the center portion 42 of the contact plate 4 on the side facing the stack 10 (the contact surface 4a). In the semiconductor device of the second embodiment, the cavity 441 is provided at the center portion 442 of the contact plate 404. With the contact plate 4 (404) provided with the recess 41 or the cavity 441 at its center, when the spring 5 pressurizes the center portion 42 (442) of the contact plate 4 (404), the contact plate 4 (404) pressurizes the stack 10 on both sides of the recess 41 (or the cavity 441) in the Y direction. Due to this, the unevenness of pressure on the stack 10 in the Y direction is reduced.

In addition to the both sides in the Y direction, the contact plate 4 may contact the stack 10 around the recess 41 or the cavity 441.

The grease 32 may be interposed between the semiconductor modules 2 and the coolers 3. Further, each of the semiconductor modules 2 may include the package 22 housing the semiconductor elements 24a, 24b, and the heat radiation plates 23a, 23b exposed at the surface of the package 22 that faces its corresponding cooler 3. As seen along the stacking direction, the recess 41 or the cavity 441 may be arranged so as to overlap with the heat radiation plates 23a, 23b (FIGS. 5, 7, 10, and 11). The grease becomes less likely to flow since the pressure which the contact plate applies to the range of the heat radiation plates 23a, 23b is suppressed. Especially when the profile of the recess or the cavity surrounds the heat radiation plates as seen in the stacking direction, the grease becomes less likely to flow from the entire surfaces of the heat radiation plates 23a, 23b.

As seen in the stacking direction of the stack 10 the range(s) where the spring contacts the contact plate may be located inside the profile of the recess or the cavity. The pressure concentration can effectively be alleviated since the pressure from the spring is not directly transferred to the stack.

Specific examples of the present invention have been described in detail. However, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device comprising:
   a stack in which a cooler and a semiconductor module are stacked, the semiconductor module housing a semiconductor element;
   a contact plate contacting the stack in a stacking direction of the semiconductor module and the cooler; and
   a spring contacting the contact plate and pressurizing the stack via the contact plate in the stacking direction, wherein
   the spring contacts a center portion of the contact plate, the center portion being located at the center of the contact plate relative to a direction perpendicular to the stacking direction,
   a recess or a cavity is provided at the center portion of the contact plate, the recess facing the stack, and
   the contact plate directly contacts the stack around the recess or the cavity.

2. The semiconductor device of claim 1, wherein grease is interposed between the semiconductor module and the cooler.

3. The semiconductor device of claim 1, wherein
   the semiconductor module includes a package and a heat radiation plate, the package housing the semiconductor element, and the heat radiation plate exposed at a surface of the package that faces the cooler, and
   the recess or the cavity is arranged so as to overlap with the heat radiation plate in a view of the semiconductor device in the stacking direction.

4. The semiconductor device of claim 3, wherein an outline of the recess or the cavity surrounds the heat radiation plate in the view of the semiconductor device in the stacking direction.

* * * * *